United States Patent [19]
Kane

[11] Patent Number: 5,132,560

[45] Date of Patent: Jul. 21, 1992

[54] VOLTAGE COMPARATOR WITH AUTOMATIC OUTPUT-LEVEL ADJUSTMENT

[75] Inventor: Michael G. Kane, Rocky Hill, N.J.

[73] Assignee: Siemens Corporate Research, Inc., Princeton, N.J.

[21] Appl. No.: 758,324

[22] Filed: Aug. 28, 1991

Related U.S. Application Data

[63] Continuation of Ser. No. 590,119, Sep. 28, 1990, abandoned.

[51] Int. Cl.[5] .......................... H03K 5/20; H03F 3/45
[52] U.S. Cl. .................................. 307/355; 307/359; 307/362
[58] Field of Search ............... 307/350, 355, 494, 475, 307/359, 362; 328/146, 147; 330/253, 261

[56] References Cited

U.S. PATENT DOCUMENTS

| | | | |
|---|---|---|---|
| 4,110,641 | 8/1978 | Payne | 307/355 |
| 4,160,175 | 7/1979 | Tront | 307/358 |
| 4,210,830 | 7/1980 | Fukahori | 307/362 |
| 4,371,843 | 2/1983 | Fang et al. | 330/253 |
| 4,453,092 | 6/1984 | Joseph | 307/355 |
| 4,479,094 | 10/1984 | Harris | 330/261 |
| 4,494,019 | 1/1985 | Brown | 307/491 |
| 4,536,699 | 8/1985 | Baker | 323/276 |
| 4,538,114 | 8/1985 | Kunimi et al. | 330/253 |
| 4,598,215 | 7/1986 | Schechtman et al. | 307/355 |
| 4,599,575 | 7/1986 | Bernard | 330/258 |
| 4,616,189 | 10/1986 | Pengue, Jr. | 330/253 |
| 4,700,144 | 10/1987 | Thomson | 330/257 |
| 4,970,471 | 11/1990 | Taylor | 330/253 |

OTHER PUBLICATIONS

Derwent Abstract "MOTI U21 87-192206/27 US 4675-551-A".

L. E. Larson et al., "GaAs Differential Amplifiers", GaAs IC Symposium, pp. 19-22, 1985 IEEE.

Primary Examiner—Stanley D. Miller
Assistant Examiner—Sinh N. Tran
Attorney, Agent, or Firm—Adel A. Ahmed

[57] ABSTRACT

A differential voltage comparator for driving a digital logic gate includes a differential amplifier stage for receiving $V_{IN}$ and NOT $V_{IN}$ input signals, a left voltage level shifter for shifting the output of the left side of the differential amplifier by a predetermined voltage, and a differential current source for the differential amplifier-biased on one side by the left voltage level shifter and on its other side by a reference voltage. An output voltage level shifter shifts down the output voltage from the differential comparator by a predetermined amount; and applied the shifted voltage to an output terminal. Transistors in the differential current source are matched to transistors in the digital logic gate being driven for providing an offset in the differential current source; the latter along with equating the shift down voltage of the left voltage level shifter to the sum of the reference voltage and output shift down voltage, ensures that when $V_{IN}$ is equal to NOT $V_{IN}$, the level of the output voltage from the comparator is substantially equal to the logic switching point of the digital logic gate.

31 Claims, 2 Drawing Sheets

VOLTAGE COMPARATOR WITH AUTOMATIC OUTPUT-LEVEL ADJUSTMENT

This is a continuation of Ser. No. 07/590,119 filed Sep. 28, 1990, now abandoned.

FIELD OF THE INVENTION

The field of the present invention relates generally to voltage comparators, and more particularly to voltage comparators for driving integrated circuit (IC) logic gates.

BACKGROUND OF THE INVENTION

Digital integrated circuits frequently require voltage comparators as buffers on input lines in order to perform logic-level shifting from one set of logic levels to another, or to accept the differential input signals used in noisy environments. A well-designed voltage comparator will have high gain and low input offset voltage, with the result that sensitive and accurate comparisons can be performed between the input signals. However, it is equally important that the digital output level of the comparator be compatible with the digital logic levels of the IC's internal logic gates.

Ideally the output signal of the voltage comparator will be at a level exactly at the switching point of the internal digital logic when the two inputs to the comparator are at the same voltage, i.e. with no input differential voltage. When one of the differential inputs is raised or lowered, the output of the comparator will respond by switching to a high or low level, typically representative of a digital "1" or "0", respectively. If the level of the output voltage of the comparator is not at the logic switching point when its inputs are at the same voltage, then the output of the comparator will be a skewed version of the differential input. In the presence of small differential input signals, the comparator's output may not make transitions past the logic switching point, and input data will be lost.

Accordingly, for high sensitivity to input signals it is important not only that the input voltage comparator have a low input offset voltage, but also that the output level be centered around the digital logic switching point. This can be difficult to achieve in the presence of supply voltage, temperature, and process variations. All of these variations tend to alter the comparator's output voltage level.

There have been many attempts in the prior art to provide a voltage comparator for responding to input signals for accurately driving integrated circuit logic dates. Fang et al. U.S. Pat. No. 4,371,843 teaches the use of feedback from one side of an input stage of a differential amplifier to drive a single transistor current source. In a paper authored by L. E. Larson et al., entitled "GaAs DIFFERENTIAL AMPLIFIERS", appearing in the 1985 *GaAs IC Symposium Technical Digest*, IEEE, pages 19 through 22, the use of level shifting circuits on both sides of a ,differential amplifier is taught. Also, feedback from one side of the input differential stage is used to drive a single transistor current source. Harris U.S. Pat. No. 4,479,094 also teaches a use of a level shifting circuit, but only on one side of a differential amplifier.

In Pengue, U.S. Pat. No. 4,616,189 a differential amplifier is disclosed that includes level shifting circuits for shifting voltages provided at differential outputs of the amplifier down to GaAs compatible output levels. Pengue also teaches the use of a differential current source with common-mode feedback from the input differential pair.

SUMMARY OF THE INVENTION

An object of the present invention is to provide an improved voltage comparator for driving IC logic gates.

Another object of the invention is to provide a voltage comparator capable of providing an output voltage having a level substantially equal to the switching point of the digital logic gate being driven.

These and other objects of the invention are provided in a differential comparator circuit including voltage level shifting means for shifting the output of the left side of an included differential stage downward by a predetermined voltage, by serving as a feedback voltage to drive a differential current source controlling the magnitude of current flowing through the differential amplifier. The other side of the differential current source is driven by voltage reference means. The output stage of the present voltage comparator includes output voltage level shifting means, which in combination with the differential current source means, voltage reference means, left side voltage level shifting means, and matching of the transistors of the differential current source to those of the logic gate being driven, insures that the level of the output voltage from the comparator is substantially at the level of the logic switching point for the logic gate being driven at times that the two voltage inputs to the voltage comparator are at the same voltage or equal in voltage.

BRIEF DESCRIPTION OF THE DRAWINGS

Various embodiments of the present invention will be described in detail below with reference to the drawings, in which like items are identified by the same reference designation, wherein.

DETAILED DESCRIPTION OF THE PREFERRED EMBODIMENTS OF THE INVENTION

Figure 1:
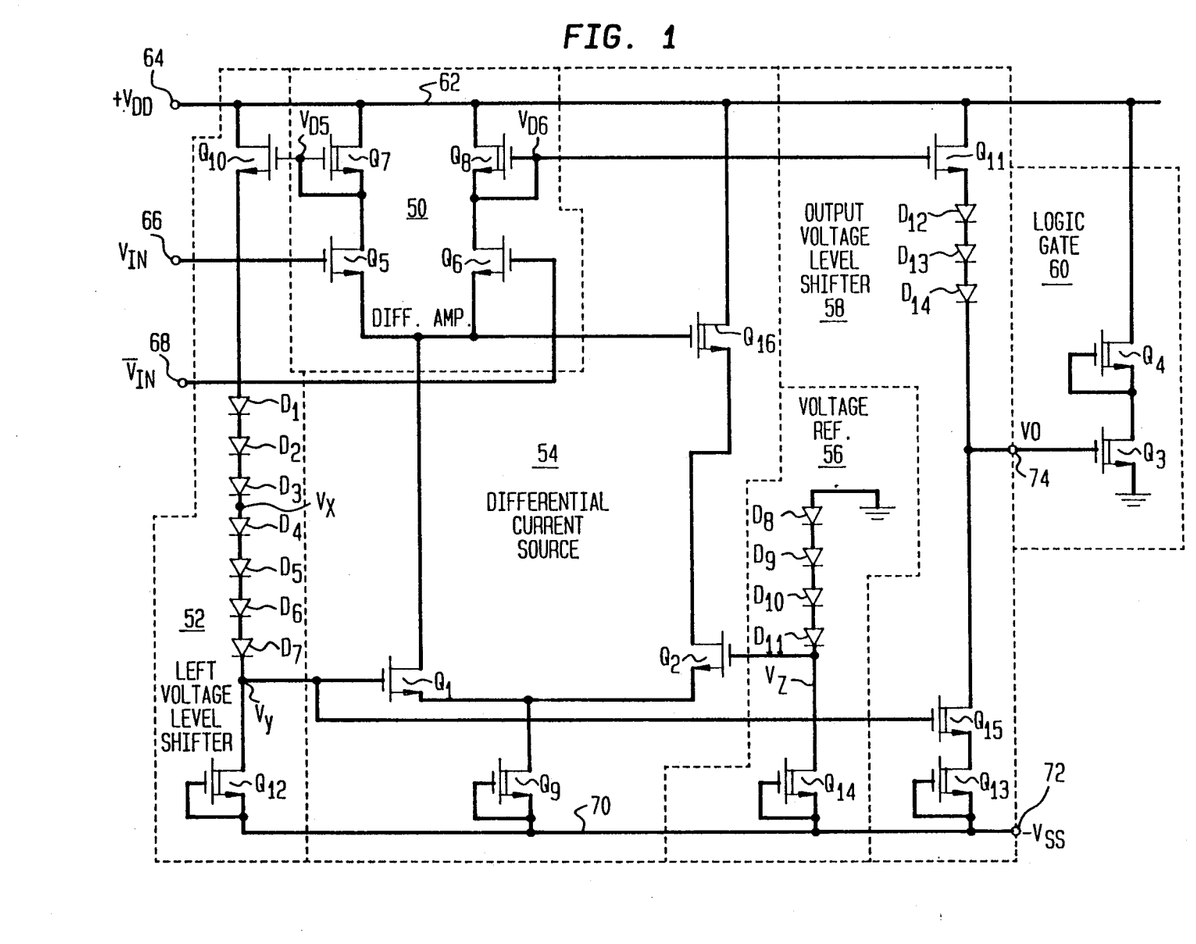
FIG. 1 shows a circuit schematic diagram of one embodiment of the invention.

With reference to FIG. 1, the embodiment shown is meant for using an N-channel process to provide the voltage comparator in integrated circuit form, preferably on the same substrate or chip as the logic gate being driven. Accordingly, as illustrated, the comparator can be fabricated using NMOS or N-channel MOSFET circuits, for example. However, as would be known to one of ordinary skill in the art, the embodiment of the invention of FIG. 1 can also be modified for using devices of the opposite conductivity type, for fabricating the comparator using P-channel processing.

As shown in FIG. 1, the illustrated embodiment of the invention includes transistors $Q_5$ and $Q_6$ forming a standard differential pair or amplifier 50, with $Q_7$ and $Q_8$ as depletion-mode load devices. Transistors $Q_{10}$ and $Q_{12}$, and diodes $D_1$ through $D_7$ form a left voltage level shifter 52 that shifts the output of the left side of the differential stage 50 down by seven diode drops (the numbers of diodes used in this circuit are chosen as examples). The shifted voltage is applied as a feedback voltage to one side of the differential current source 54 formed by $Q_1$, $Q_2$, $Q_9$, and $Q_{16}$.

The differential current source 54, together with the voltage reference 56 formed by $Q_{14}$ and diodes $D_8$ through $D_{11}$, and the output voltage level shifter 58 formed by $Q_{11}$, $Q_{13}$, and $Q_{15}$, and diodes $D_{12}$ through $D_{14}$, ensures that the output voltage level $V_{OUT}$ sits exactly at the logic switching point of the standard logic gate 60 formed by $Q_3$ and $Q_4$ In general terms, the comparator's output level is matched to the logic switching point because $Q_1$ and $Q_3$ are matched to each other, i.e. either identical or differing only by a width ratio, and $Q_2$ and $Q_4$ are matched to each other, differing only by the same ratio as appears between $Q_1$ and $Q_3$. As a result, an offset is introduced into the differential current source 54. In this manner, the output voltage of the present voltage comparator is substantially matched to the input switching point of the digital logic gate 60, regardless of typical voltage supply, temperature, and processing variations. A more detailed description of this embodiment of the invention follows below.

With further reference to FIG. 1, the differential amplifier section 50 includes transistors $Q_5$ and $Q_6$ with their source electrodes connected in common to the drain electrode of transistor $Q_1$ and the gate electrode of transistor $Q_{16}$, the latter two being included in the differential current source 54. The drain electrode of transistor $Q_5$ is connected to the common connection of the gate and source electrodes of transistor $Q_7$, and the gate electrode of transistor $Q_{10}$ of the left voltage level shifter 52. The drain electrode of transistor $Q_6$ is connected in common to the gate and source electrodes of transistor $Q_8$, and the gate electrode of transistor $Q_{11}$ of the output voltage level shifter 58. The drain electrodes of transistors $Q_7$, $Q_8$, $Q_{10}$, $Q_{11}$, $Q_{16}$, and $Q_4$ (part of logic gate 60) are connected in common to the positive voltage bus 62 for connection via terminal 64 to a source of operating voltage $+V_{DD}$, typically +5.0 volts DC. The gate electrode of transistor $Q_5$ is connected to an input terminal 66 for receiving a digital input voltage $V_{IN}$. The gate electrode of transistor $Q_6$ is connected to another voltage input terminal 68 for receiving NOT $V_{IN}$.

The left voltage level shifter 52 also includes transistor $Q_{10}$ with its source electrode connected to the anode of a diode $D_1$. Diode $D_1$ is the lead or first diode of a series connected string of diodes $D_1$ through $D_7$, respectively, with the last diode of the string $D_7$ having its cathode electrode connected in common to the drain electrode of transistor $Q_{12}$ and the gate electrodes of transistor $Q_1$ (part of differential current source 54) and transistor $Q_{15}$ (part of output voltage level shifter 58). The gate and source electrodes of transistor $Q_{12}$ are connected in common to the common connection of the gate and source electrodes of transistors $Q_9$, $Q_{14}$, and $Q_{13}$, respectively, and the negative voltage rail 70 for connection via voltage terminal 72 to a source reference potential or negative operating voltage $-V_{SS}$, typically $-5.0$ volts DC. Note that transistors $Q_9$, $Q_{13}$, and $Q_{14}$ are included in the differential current source 54, output voltage level shifter 58, and voltage reference 56, respectively.

The differential current source 54 also includes transistors $Q_1$ and $Q_2$ having their source electrodes connected in common to the drain electrode of transistor $Q_9$. The drain electrode of transistor $Q_2$ is connected to the source electrode of transistor $Q_{16}$.

The voltage reference 56 also includes a series connected string of diodes $D_8$ through $D_{11}$, respectively, with the anode electrode of the first diode $D_8$ of the string being connected to a source of reference potential, ground in this example. The last diode $D_{11}$ of the string has its cathode electrode connected in common to the gate electrode of transistor $Q_2$ (part of differential current source 54), and the drain electrode of transistor $Q_{14}$.

The output voltage level shifter 58 further includes a series connected string of diodes $D_{12}$ through $D_{14}$, respectively, with the first diode of the string $D_{12}$ having its anode electrode connected to the source electrode of transistor $Q_{11}$, and the last diode of the string $D_{14}$ having its cathode electrode connected in common to an output voltage terminal 74, and the drain electrode of transistor $Q_{15}$. The source electrode of transistor $Q_{15}$ is connected to the drain electrode of transistor $Q_{13}$.

In this example, the logic gate 60 includes transistors $Q_3$ and $Q_4$. Transistor $Q_4$ has its gate and source electrodes connected in common to the drain electrode of transistor $Q_3$, and in this example is a depletion mode NMOS transistor. Transistor $Q_3$ also has its gate electrode connected to output voltage terminal 74 for receiving an input voltage from the voltage comparator, and a source electrode connected to ground, in this example. In this example, transistor $Q_3$ is an enhancement mode transistor.

In the preferred embodiment of the invention, as shown, transistors $Q_2$, $Q_7$, $Q_8$, $Q_9$, and $Q_{12}$ through $Q_{16}$, are depletion mode transistors. Transistors $Q_1$ is an enhancement mode transistors. Transistors $Q_5$, $Q_6$, $Q_{10}$, and $Q_{11}$ can be either enhancement mode or depletion mode transistor.

Note that transistors $Q_7$, $Q_8$, $Q_9$, $Q_{12}$, $Q_{13}$, and $Q_{14}$ each provide current sources with zero volts between their commonly connected gate source electrodes, respectively. Transistors $Q_{15}$ and $Q_{16}$ each are source followers, which in normal operation have their respective source voltage substantially exactly tracking their gate voltage, thereby causing the voltage drop between their respective gate and source electrodes to be zero volts.

Note further that the logic gate 60 is not part of the present invention, but is included for purposes of illustrating that the comparator design is dependent upon the design of the digital logic it is driving. Also, for proper operation, transistors $Q_1$ and $Q_2$ of differential current source 54 must mimic the operation of transistors $Q_3$ and $Q_4$, respectively, of logic gate 60, in this example.

Note also that transistors $Q_5$, $Q_6$, $Q_{10}$, and $Q_{11}$ are shown as enhancement-mode transistors, and that such transistors generally have a smaller "knee voltage" or saturation voltage relative to depletion-mode transistors, and therefore would provide a larger output voltage swing. However, although it is preferred that these transistors be enhancement-mode for the reason given, the present comparator will operate almost as well if these transistors are alternatively depletion-mode type.

Also in the preferred embodiment, certain other transistors must be matched for providing optimum operation of the present comparator. More specifically, transistors $Q_5$ and $Q_6$ must be substantially identical to minimize input offset. Transistors $Q_7$ and $Q_8$ must be substantially identical to minimize input offset, and each of these transistors must also be substantially matched to transistor $Q_9$. However, transistors $Q_7$ and $Q_8$ should have one-quarter the width of transistor $Q_9$, in order to insure that they draw the appropriate magnitude of current. Transistor pairs $Q_{10}/Q_{12}$ and $Q_{11}/Q_{13}$ must be identically matched by having a fixed width ratio, to avoid or minimize the output offset voltage.

In order for $Q_{15}$ to operate with zero volt between its gate and source electrodes, it must be substantially identically matched to transistor $Q_{13}$. With the exception of having one-half the width of transistor $Q_{16}$, $Q_9$ must be identically matched to $Q_{16}$ to insure that under balanced conditions in the differential current source 54, that $Q_{16}$ operates with zero volt between its gate and source electrodes. Similarly, $Q_2$ must be half the width of $Q_9$, but otherwise substantially identically matched thereto, to insure that under balanced conditions in differential current source 54, $Q_2$ is operating with zero volt gate to source voltage in mimicking the operation of $Q_4$ of logic gate 60. The width ratios of transistors $Q_1$ and $Q_2$ must be equal to the width ratios of transistors $Q_3$ and $Q_4$, with the transistors of each pair being otherwise substantially identical to the transistors of the other pair, for substantially insuring the correct offset voltage level in the differential current source 54.

Also in the preferred embodiment, the voltage drop across the string of series connected diodes $D_1$ through $D_7$ must be substantially equal to the sum of the voltage drops across the two series string of diodes $D_8$ through $D_{11}$, and $D_{12}$ through $D_{14}$. Typically, this is accomplished by matching the combination of transistor $Q_{14}$ and diode string $D_8$ through $D_{11}$, apart from a fixed width ratio, to the combination of transistor $Q_{12}$ and any four of the seven diodes of diode string $D_1$ through $D_7$. As a result, the remaining three diodes of the diode string $D_1$ through $D_7$, together with transistor $Q_{12}$, must be identical apart from a fixed width ratio, to the combination of transistor $Q_{13}$ and its associated three diodes $D_{12}$ through $D_{14}$. In other words, the current densities through the diode strings $D_1$ through $D_7$, $D_8$ through $D_{11}$, and $D_{12}$ through $D_{14}$, respectively, must be made equal in order to insure matching of the voltage drops across them.

In the preferred embodiment, as indicated above, it is important that certain width relationships amongst the various transistors be maintained. In summary, for purposes of illustrating this requirement in simplified equations below, "W" designates width. These relationships are as follows below in equations (1) through (6):

$$WQ_1/WQ_2 = WQ_3/WQ_4 \qquad (1)$$

$$WQ_2 = \tfrac{1}{2} WQ_9 \qquad (2)$$

$$WQ_{10}/WQ_{12} = WQ_{11}/WQ_{13} \qquad (3)$$

$$WQ_{15} = WQ_{13} \qquad (4)$$

$$WQ_7 = WQ_8 = \tfrac{1}{4} WQ_9 = \tfrac{1}{2} WQ_{16} \qquad (5)$$

$$WQ_5 = WQ_6 \qquad (6)$$

It can be shown mathematically, that the present invention does provide a voltage comparator having an output that is matched to the logic switching level of a logic gate 60, in this example. The proof follows below.

As a result of the widths of transistors $Q_5$ and $Q_6$ being equated or matched, and of transistors $Q_7$ and $Q_8$ being equated or matched, when input voltage $V_{IN}$ is equal to NOT $V_{IN}$, the magnitudes of current flowing through transistors $Q_7$ and $Q_8$ will be equal, causing the voltages $V_{D5}$ and $V_{D6}$ to be equal.

Transistor $Q_{15}$ operates to equalize the voltages across transistors $Q_{12}$ and $Q_{13}$, as a result of the voltage between the gate and source electrodes of transistor $Q_{15}$ being substantially zero volt. In turn, this causes the magnitude of current flowing through transistor $Q_{12}$ ($IQ_{12}$) to be equal to the magnitude of current flowing through transistor $Q_{13}$ ($IQ_{13}$).

As a result of the widths of transistors $Q_{10}$ and $Q_{12}$ being equated, and of transistors $Q_{11}$ and $Q_{13}$ being equated, the voltage $V_X$ (at the common connection of diodes $D_3$ and $D_4$) is equal to the output voltage $V_O$ at terminal 74. Under the given conditions that the input voltages $V_{IN}$ and NOT $V_{IN}$ are equal, the output voltage $V_O$ can be determined by solving for $V_X$, since $V_X$ has been shown to be equal to $V_O$.

Figure 2:
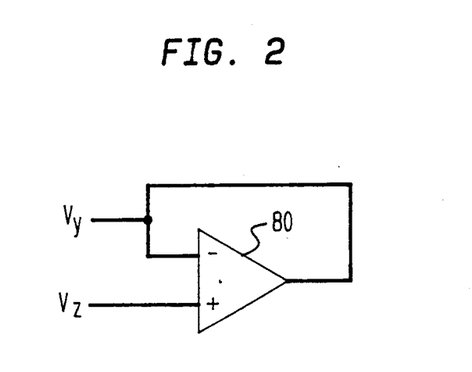
FIGS. 2 and 3 show idealized and simplified partial circuit schematic diagrams useful in illustrating the operation of particular embodiments of the invention.

The combination of transistors $Q_1$, $Q_2$, $Q_5$–$Q_{10}$, $Q_{12}$, and $Q_{16}$ are idealized to be a gain stage 80, as shown in FIG. 2. Also, assume that the widths of transistors $Q_1$ and $Q_2$ are equal, even though the widths of transistors $Q_3$ and $Q_4$ are unequal. Note that $V_Y$ is the voltage at the common connection of the gate electrode of transistor $Q_1$, cathode electrode of diode $D_7$, and drain electrode of transistor $Q_{12}$ (see FIG. 1). As long as the idealized stage 80 is kept in its active region, the level of $V_Y$ will be substantially equal to the level of $V_Z$ (see FIG. 2) since as shown in equation (7) below:

$$V_Y = [A/(A+1)] V_Z \qquad (7)$$

whereby $V_Y$ approximates $V_Z$ when A is large.

Note that $V_Z$ is the voltage appearing at the common connection of the gate electrode of transistor $Q_2$, the cathode electrode of diode $D_{11}$, and the drain electrode of transistor $Q_{14}$. Accordingly, $V_Z$ is equal to a negative voltage having a level equal to four diode drops (sum of the drops of diodes $D_8$ through $D_{11}$. The level of voltage of $V_Y$ is equal to $V_X$ minus four diode drops, as a result of transistors $Q_{12}$ and $Q_{14}$ being matched to their respective diode strings. Accordingly, the following relationships hold:

$$V_X - 4V_{DIODE} = -4V_{DIODE} \qquad (8)$$

Therefore:

$$V_X = 0, \text{ whereby } V_O = 0 \text{ when } V_{IN} = NOT\ V_{IN} \qquad (9)$$

But in a generalized logic gate:

$$WQ_3 \neq WQ_4 \qquad (10)$$

Therefore:

$$V_{SWITCH} \neq 0 \text{ for logic gate 60} \qquad (11)$$

When $V_{IN} = $ NOT $V_{IN}$, the output $V_{OUT} \neq V_{SWITCH}$, and the sensitivity of the overall comparator is degraded.

$V_{SWITCH}$ for the logic gate 60 generally occurs where the current $I_{Q3} = I_{Q4}$ (region of maximum gain).

Assume that:

$$Q_{Q1}/W_{Q2} = W_{Q3}/W_{Q4} \quad (12)$$

with $Q_1, Q_3$ having the same $V_T$, and $Q_2, Q_4$ having the same $V_T$.

Figure 3:
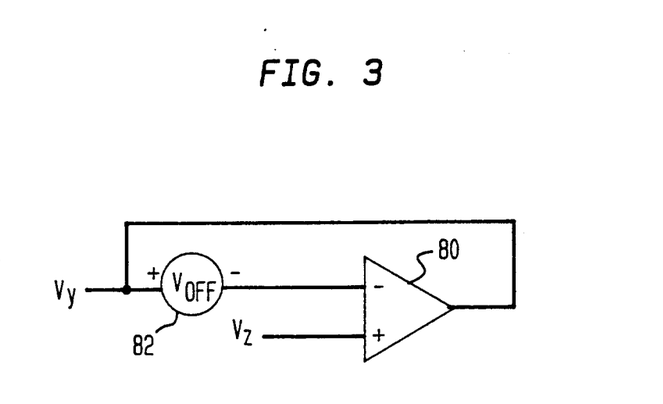

Since $W_{Q1} \neq W_{Q2}$ (in general) and $V_{T1} \neq V_{T2}$, an offset is introduced in the $Q_1/Q_2$ pair of transistors (see FIG. 3), Whereby:

$$V_Y \approx V_Z + V_{OFF} \quad (13)$$

$$=> V_X - 4_{DIODE} = -4V_{DIODE} + V_{OFF} \quad (14)$$

$$=> V_X = V_{OFF} \quad (15)$$

$$=> V_{OUT} = V_{OFF} \text{ when } V_{IN} = NOT\ V_{IN} \quad (16)$$

$V_{OFF}$ is the voltage required for $I_{Q1} = I_{Q2}$ (because $W_{Q9} = 4W_{Q7} = 4W_{Q8}$). The sizing ratio $W_{Q1}/W_{Q2} = W_{Q3}/W_{Q4}$ (equation 1) together with the use of $Q_{16}$ to insure that $V_{DS,Q1} = V_{DS,Q2}$ causes $V_{OFF} = V_{SWITCH}$ when $W_{Q2} = W_{Q9}/2$ (equation 2).

Accordingly:

$$V_{OUT} = V_{SWITCH} \text{ when } V_{IN} = NOT\ V_{IN} \quad (18),$$

insuring that maximum sensitivity is achieved.

Although various embodiments of the invention have been shown for purposes of illustration, they are not meant to be limiting. Modifications to these embodiments may occur to those of skill in the art, which modifications are meant to be covered by the spirit and scope of the appended claims. For example, as previously mentioned, the comparator of FIG. 1 can be provided by devices of opposite conductivity type to those shown, thereby permitting P-channel processing, rather than N-channel processing.

What is claimed is:

1. A differential voltage comparator for driving a digital logic gate, said comparator being responsive to $V_{IN}$ and NOT $V_{IN}$ input signals being "high" and "low", respectively, for providing a "high" output signal, or being "low" and "high", respectively, for providing a "low" output signal, wherein when said $V_{IN}$ and NOT $V_{IN}$ input signals are of equal voltage, said comparator produces an output signal matched to the switching point of said digital logic gate, even in the presence of temperature, operating voltage, and processing variations, said comparator comprising:

a first voltage rail for connection to a source of first operating voltage;

a second voltage rail for connection to a source of operating voltage of opposite polarity to said first operating voltage;

a source of reference potential;

differential amplifier means including first and second main current paths each connected in common at one end to said first voltage rail, first and second central electrodes for receiving $V_{IN}$ and NOT $V_{IN}$ digital input signals, respectively, for controlling the magnitude of current flowing through said first and second main current paths, respectively, first and second nodes in said first and second main current paths, respectively, at which first and second output signals are developed, respectively;

differential current source means including a first main current path having one end connected in common to the other ends of the first and second main current paths of said differential amplifier means, and having its other end connected to said second voltage rail, a first control electrode for receiving a feedback signal for controlling the impedance of its associated said first main current path, a second main current path having one end connected to said one end of its associated said first main current path, and its other end to said second voltage rail, and a second control electrode for receiving a reference voltage for controlling the impedance of its associated said second main current path;

said differential current source means being electrically matched to predetermined electrical characteristics of said digital logic gate, for introducing an offset in said differential current source means;

first voltage level shifter means connected between said first and second voltage rails, including means for sensing the current flowing through said first main current path of said differential amplifier means, for producing said feedback signal for application to said first control electrode of said differential current source means, for shifting the level of said first output signal at said first node of the said differential amplifier means down by a predetermined amount;

voltage reference means connected between said second voltage rail and said source of reference potential, for producing said reference voltage having a predetermined level of voltage for application to said second control electrode of said differential current source means;

an output voltage terminal for providing an output voltage from said comparator; and second voltage level shifter means connected between said first and second voltage rails, including means for sensing the flow of current in said second main current path of said differential amplifier means and voltage at said second node of said differential amplifier means, for shifting the voltage at said second node down by a predetermined amount and applying the shifted down voltage to said output voltage terminal;

the combination of said differential current source means, voltage reference means, and second voltage level shifter means ensuring that whenever said input signals $V_{IN}$ and NOT $V_{IN}$ are equal, the level of said output voltage at said output terminal is substantially at the logic switching point of said digital logic gate.

2. The differential voltage comparator of claim 1, wherein said differential amplifier means further includes:

a first transistor having said first control electrode, and a main current path having one end connected to said first node;

a second transistor having said second control electrode, and a main current path having one end connected to said second node, the other ends of the main current paths of said first and second transistors providing the other ends of said first and second main current paths; and third and fourth transistors each having a main current path with one end connected to said first voltage rail, and their other ends connected to said first and second nodes, respectively, and individual control electrodes connected to said first and second nodes, respectively, said third and fourth transistors serving as loads or current sources for said first and second transistors, respectively, said first main current path being provided by the series connected main current paths of said first and third transistors, said second main current path being provided by the series connected main current paths of said second and fourth transistors.

3. The differential voltage comparator of claim 2, wherein said first voltage level shifter means includes:

a fifth transistor having a main current path with one end connected to said first voltage rail, and a control electrode connected to the control electrode of said third transistor;

first unidirectional current means connected between the other end of the main current path of said fifth transistor and said first control electrode of said differential current source means, for producing the predetermined voltage thereacross for shifting down said first output signal, said first unidirectional current means being polarized for passing current in the same direction between said first and second voltage rails, as current passing through said differential amplifier means; and a sixth transistor having a main current path with one end connected to the common connection of said unidirectional current means and said first control electrode of said differential current source means, and its other end connected to said second voltage rail, said sixth transistor further having a control electrode connected to said second voltage rail, said sixth transistor providing a current source.

4. The differential voltage comparator of claim 3, wherein said first voltage level shifter means further includes said first unidirectional current means comprising a plurality of diodes connected in a series chain.

5. The differential voltage comparator of claim 3, wherein said differential current source means includes:

a seventh transistor having a control electrode providing said first control electrode, and a main current path with one end connected to the common connection of the other ends of the main current paths of said first and second transistors;

an eighth transistor having a main current path connected between the other end of the main current path of said seventh transistor and said second voltage rail, and a control electrode connected to said second voltage rail, said eighth transistor providing a current source, the main current paths of said seventh and eighth transistors providing said first main current path of said differential current source means; and a ninth transistor having a main current path with one end coupled to the commonly connected other ends of the main current paths of said first and second transistors, and its other end to the common connection of the other end of said seventh transistor with an end of the main current path of said eighth transistor, and a control electrode providing said second control electrode.

6. The differential voltage comparator of claim 5, wherein said differential current source means further includes a tenth transistor having a main current path connected between said first voltage rail and said one end of the main current path of said ninth transistor, and a control electrode connected to commonly connected other ends of said first and second transistors, the series connected main current paths of said ninth and tenth transistors providing said second main current path of said differential current source means.

7. The differential voltage comparator of claim 6, wherein said voltage reference means includes:

an eleventh transistor having a control electrode connected to said second voltage rail, and a main current path connected between the control electrode and said second voltage rail, said eleventh transistor providing a current source; and second unidirectional current means connected between the common connection of an end of the main current path of said eleventh transistor and the control electrode o said ninth transistor, and said source of reference potential, the voltage drop across said second unidirectional current means providing said reference voltage, said second unidirectional current means being polarized for passing current in the same direction relative to said second voltage rail as current flowing through said differential voltage amplifier means.

8. The differential voltage comparator of claim 7, wherein said second unidirectional current means comprises a plurality of diodes connected in a series string.

9. The differential voltage comparator of claim 7, wherein said second voltage level shifter means includes:

a twelfth transistor having a control electrode connected to the control electrode of said fourth transistor, and a main current path having one end connected to said first voltage rail;

third unidirectional current means having one end connected to the other end of the main current path of said twelfth transistor, and its other end connected to said output terminal, for providing thereacross a voltage drop for shifting down the output voltage from said second node of said differential amplifier means; and a thirteenth transistor having a control electrode connected to said second voltage rail, and a main current path having one end connected to said output terminal and its other end connected to said second voltage rail, said thirteenth transistor providing a current source.

10. The differential voltage comparator of claim 9, wherein said second voltage level shifter means further includes a fourteenth transistor having a main current path with one end connected to said output terminal and its other end connected to the one end of the main current path of said thirteenth transistor, for connecting the latter to said output terminal, and a control electrode connected to the common connection of the control electrode of said seventh transistor and said first unidirectional current means.

11. The differential voltage comparator of claim 10, wherein said first through fourteenth transistors are all of the same conductivity type.

12. The differential voltage comparator of claim 10, wherein the voltage drop across said first unidirectional current means is made equal to the sum of the voltage drops across said second and third unidirectional current means.

13. The differential voltage comparator of claim 12, wherein said digital logic gate includes a first transistor having a main current path with one end connected to said first voltage rail, and a control electrode connected to the other end of said main current path, and a second transistor having a main current path with one end connected to the said source of reference potential, and its other end connected to the common connection of said control electrode and main current path of said first transistor, and a control electrode for connection to said output terminal of said differential voltage comparator, said first and second transistors of said digital logic gate being of the same conductivity type, said differential voltage comparator further including:
said first through fourteenth transistors being of the same conductivity type as said first and second transistors of said digital logic gate.

14. The differential voltage comparator of claim 13, further including:
said first and second transistors being matched, and said third and fourth transistors being matched, to substantially reduce input offset.

15. The differential voltage comparator of claim 14, further including:
said fifth and sixth transistors as a pair being matched to said twelfth and thirteenth transistors as a pair, for substantially reducing output offset.

16. The differential voltage comparator of claim 15, further including:
said ninth and seventh transistors as a pair being matched to said first and second transistors of said digital logic gate, respectively, for ensuring the proper offset in said differential current source means.

17. The differential voltage comparator of claim 16, wherein said first and second transistors of said digital logic gate are MOSFET depletion mode and MOSFET enhancement mode transistors, respectively, and wherein said differential voltage comparator further includes:
said third, fourth, sixth, eighth, ninth, tenth, eleventh, thirteenth, and fourteenth transistors each being depletion mode MOSFET transistors;
said seventh transistor comprising an enhancement mode MOSFET transistor; and
said first, second, fifth, and twelfth transistors each comprising either one of enhancement mode or depletion mode MOSFET transistors.

18. The differential voltage comparator of claim 17, further including:
said third and fourth transistors being of one-quarter the width of said eighth transistor, and otherwise substantially electrically identical to said eighth transistor.

19. The differential voltage comparator of claim 18, further including:
said fifth and sixth transistors having a width ratio equal to that of said twelfth and thirteenth transistors.

20. The differential voltage comparator of claim 19, further including:
said thirteenth transistor being substantially identical or matched to said fourteenth transistor.

21. The differential voltage comparator of claim 20, further including:
said tenth transistor being one-half the width of said eighth transistor, said eighth and tenth transistors being otherwise substantially matched.

22. The differential voltage comparator of claim 21, wherein said ninth transistor is one-half the width of said eighth transistor, but otherwise substantially matched thereto.

23. The differential voltage comparator of claim 22, wherein the ratio of the widths of said ninth and seventh transistors is substantially identical to ratio of the widths of said first and second transistors respectively of said digital logic gate, said ninth and seventh transistors being otherwise substantially matched to said first and second transistors, respectively, of said digital logic gate.

24. The differential voltage comparator of claim 23, wherein said first through fourteenth transistors are fabricated on a common substrate with said first and second transistors of said digital logic gate.

25. The differential voltage comparator of claim 23, wherein said first through fourteenth transistors are fabricated on a common substrate.

26. The differential voltage comparator of claim 23, wherein said first through fourteenth transistors are NMOS transistors.

27. A differential voltage comparator responsive to digital input signals for accurately driving integrated circuit digital logic, with the output voltage of the comparator being matched to the input switching point of the digital logic whenever $V_{IN}$ and NOT $V_{IN}$ input signals to said comparator are equal in voltage with zero differential between them, even in the presence of temperature, operating voltage and processing variations, said comparator comprising:
a first voltage rail for connection to a source of operating voltage of one polarity;
a second voltage rail for connection to a source of operating voltage of opposite polarity to said one polarity;
a source of reference voltage;
a first input terminal for receiving said input signal $V_{IN}$;
a second input terminal for receiving said input signal NOT $V_{IN}$;
a differential amplifier including first and second transistors each having main current paths with one end connected in common, and a control electrode for individually connecting to said first and second input terminals, respectively, and third and fourth transistors each having a main current path connected between said first voltage rail and individually to the other ends of the main current paths of said first and second transistors, respectively, said third and fourth transistors further having control electrodes individually connected to the other ends of the main current paths of said first and second transistors, respectively, said third and fourth transistors functioning as current sources or loads for their associated one of said first and second transistors, respectively;
a first voltage level shifter, including:
fifth transistor having a control electrode connected to the common connection of the main current paths of said first and third transistors, and the control electrode of said third transistor, said fifth transistor further including a main current path having one end connected to said first voltage rail, a sixth transistor having a control electrode connected in common with one end of a main current path to said second rail, and a first plurality of diodes connected in a series string between the other ends of said current paths of said fifth and sixth transistors, said diodes being polarized for passing current between said first and second rails in the same direction as current passing through said differential amplifier, the voltage drop across said plurality of diodes determining the amount of shift down in the output voltage of the side of said differential amplifier associated with said first transistor;

a differential current source including:

a seventh transistor having a main current with one end connected in common to the one ends of the main current paths of said first and second transistors, and a control electrode connected to the common connection between the other end of the main current path of said sixth transistor and said first plurality of diodes;

an eighth transistor having a control electrode connected to the common connection of the one end of said first and second transistors, and a main current path with one end connected to said first rail;

a ninth transistor having a control electrode, and a main current path with one end connected to the other end of the main current path of said eighth transistor;

a tenth transistor having a control electrode and one end of a main current path connected in common to said second voltage rail, the other ends of the main current paths of said seventh, ninth, and tenth transistors being connected in common to one another;

a voltage reference including:

an eleventh transistor having a control electrode and one end of a main current path connected in common to said second voltage rail;

a second plurality of diodes connected in a series string with one end to said source of reference potential, and another end in common to the control electrode of said ninth transistor and the other end of the main current path of said eleventh transistor;

the diodes of said second plurality of diodes being polarized for passing current between said second voltage rail and said source of reference potential, in the same direction relative to said second voltage rail as current flowing through said differential amplifier;

the voltage drop across said second plurality of diodes providing a reference voltage to the control electrode of said ninth transistor, said eleventh transistor providing a current source;

a second voltage level shifter including:

a twelfth transistor having a control electrode connected to the common connection of the control electrode of said fourth transistor and the main current paths of said second and fourth transistors, said twelfth transistor also having a main current path with one end connected to said first voltage rail;

a thirteenth transistor having a control electrode and one end of a main current path connected to said second rail; a fourteenth transistor having a control electrode connected to the common connection of the control electrode of said seventh transistor with the other end of said sixth transistor and an end of said first plurality of series connected diodes; and a third plurality of diodes connected in a series string between to other ends of the main current paths of said twelfth and thirteenth transistors, said thirteenth transistor serving as a current source, said second voltage level shifter providing shifting down of the output voltage at the other side of said differential amplifier by the voltage drop across said third plurality of series connected diodes;

an output terminal connected to the common connection between said third plurality of series connected diodes and the other end of said fourteenth transistor;

the sum of the voltage drops of said second and third plurality of series connected diodes being made equal to the voltage drop across said first plurality of series connected diodes, said seventh and ninth transistors being matched to said digital logic gate being driven by said differential current source, with other parameters of said comparator being predetermined for insuring the output voltage of said comparator is matched to the input switching point of said digital logic when $V_{IN}$ is identical to NOT $V_{IN}$.

28. The differential voltage comparator of claim 27, wherein said digital logic gate being driven includes an MOS depletion mode first transistor having a main current path with one end connected to said first voltage rail, and a control electrode connected to the other end of its main current path, and an MOS enhancement mode second transistor having a control electrode for connection to said output terminal of said voltage comparator, and a main current path connected between said source of reference potential and the common connection of said control electrode and the other end of the main current path of said first transistor, said differential voltage comparator further including:

said first through fourteenth transistors being of the same conductivity type as said first and second transistors of said digital logic gate;

said third, fourth, sixth, eighth, ninth, tenth, eleventh, thirteenth, and fourteenth transistors each comprising MOS depletion mode transistors;

said seventh transistor comprising an MOS enhancement mode transistor; and said first, second, fifth and twelfth transistors each comprising either one of MOS enhancement mode or depletion mode transistors.

29. The differential voltage comparator of claim 28, further including:

said first and second transistors being matched to substantially reduce input offset;

said third and fourth transistors being matched to substantially reduce input offset, with each also being one-quarter the width of said tenth transistor but otherwise substantially matched thereto;

said pair of fifth and sixth transistors being matched respectively to said pair of twelfth and thirteenth transistors, for substantially reducing output offset;

said thirteenth and fourteenth transistors being matched to one another for ensuring said fourteenth transistor operates with zero volt between its gate and source electrodes;

said ninth and tenth transistors being matched, with the width of said ninth transistor being one-half the width of said tenth transistor, for operating said ninth transistor with zero gate-to-source voltage under balanced conditions in said differential current source;

said tenth and eighth transistors being matched, with the width of said eighth transistor being equal to one-half the width of said tenth transistor, for ensuring said eighth transistor operates with zero gate-to-source voltage under balanced conditions in said differential current source; and the ratios of the widths of said seventh to said ninth transistors being equal to the widths of said second to said first transistors of said digital logic gate, said two pairs of transistors being otherwise matched for insuring the required offset in said differential current source.

30. The differential voltage comparator of claim 29, wherein the voltage drop across said first plurality of diodes is made equal to the sum of the voltage drops across said second and third plurality of diodes.

31. The differential voltage comparator of claim 30, further including said first through fourteenth transistors being fabricated on a common substrate with said first and second transistors of said digital logic gate.

* * * * *